United States Patent
Furio

(10) Patent No.: US 6,633,071 B1
(45) Date of Patent: *Oct. 14, 2003

(54) CONTACT ON A P-TYPE REGION

(75) Inventor: Cyril Furio, Bordeaux (FR)

(73) Assignee: SGS-Thomson Microelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/083,713

(22) Filed: May 22, 1998

(30) Foreign Application Priority Data

May 30, 1997 (FR) .............................. 97 06904

(51) Int. Cl.[7] .................. H01L 29/47; H01L 29/812; H01L 31/07; H01L 31/108; H01L 27/095

(52) U.S. Cl. .................. 257/383; 257/473; 257/474; 257/484; 257/485; 257/486

(58) Field of Search .................. 257/4, 475, 605, 257/624, 199, 481, 383, 473, 474, 478, 484, 485, 486

(56) References Cited

U.S. PATENT DOCUMENTS

| | | | |
|---|---|---|---|
| 4,063,964 A | * 12/1977 | Peressini et al. ............ | 148/1.5 |
| 4,394,673 A | * 7/1983 | Thompson et al. .......... | 357/15 |
| 4,586,069 A | * 4/1986 | Koniger et al. ............. | 27/14 |
| 4,816,879 A | * 3/1989 | Ellwanger .................. | 357/15 |
| 4,946,803 A | * 8/1990 | Ellwnager .................. | 437/175 |
| 5,021,840 A | * 6/1991 | Morris ....................... | 357/15 |
| 5,130,760 A | * 7/1992 | Matzen et al. .............. | 357/13 |
| 5,285,084 A | * 2/1994 | Von Windheim et al. ..... | 257/77 |
| 5,331,186 A | * 7/1994 | Morizuka ................... | 257/198 |
| 5,365,102 A | * 11/1994 | Mehrotra et al. ........... | 257/475 |
| 5,612,567 A | * 3/1997 | Baliga ........................ | 257/475 |
| 5,814,873 A | * 9/1998 | Konuma ..................... | 257/449 |

OTHER PUBLICATIONS

French Search Report from French Patent Application No. 97 06904, filed May 30 , 1997.
"Infrared Photo Detectors Produced By Cluster Beam Deposition Of Aluminum Films On Silicon", IBM Technical Disclosure Bulletin, vol. 34, No. 2, Jul. 1991, New York, US, pp 100–102.
Patent Abstracts of Japan, vol. 16, No. 116 (E1181) , Mar. 24, 1992 & JP–A–03 286569 (NEC Corp.).
K.N. Tu: "Shallow and Parallel Silicide Contacts", Journal Of Vacuum Science and Technology, vol. 19, No. 1, May 1981, Jun. 1981, New York, US, pp 766–777.
European Search Report for application No. 98410058 dated Sep. 4, 1998.
Patent Abstract of Japan vol. 10, No. 65 (E–388) Mar. 14, 1986 & JP 60 214563.

* cited by examiner

Primary Examiner—Jerome Jackson
Assistant Examiner—Jesse A. Fenty
(74) Attorney, Agent, or Firm—Wolf, Greenfield & Sacks, P.C.; James H. Morris; Robert A. Skrivanek, Jr.

(57) ABSTRACT

The present invention relates to a contacting structure on a lightly-doped P-type region of a semiconductor component, this P-type region being positively biased during the on-state operation of said component, including, on the P region a layer of a platinum silicide, or of a metal silicide having with the P-type silicon a barrier height lower than or equal to that of the platinum silicide.

26 Claims, 2 Drawing Sheets

CONTACT ON A P-TYPE REGION

BACKGROUND OF THE INVENTION

1. Field of the Invention

The present invention relates to the manufacturing of semiconductor components. It more specifically aims at the implementation of a contact having an ohmic behavior over a lightly-doped P-type region.

2. Discussion of the Related Art

Conventionally, it is known in the field of semiconductors that, to make an ohmic contact between a semiconductive region and a metallization, the surface concentration of the semiconductive region must be relatively high (higher than $10^{19}$ atoms/cm$^3$). This sets various problems for the implementation of such contacts, especially on P-type semiconductive regions. Here, the case where the P-type region to be contacted forms the anode of a one-way semiconductor component, that is, of a component blocking the flowing of a current when the P-type region is negatively biased, and enabling the flowing of a current when the P-type region is positively biased, is more specifically considered, this flowing of a positively biased current (forward biasing) being possibly submitted to the application of a control current or of a voltage exceeding a determined threshold.

To discuss the problem set, the structure of a high voltage rectifying diode will be considered in relation with FIGS. 1 and 2, that is, of a diode capable of withstanding a relatively high voltage in reverse biasing.

FIG. 1 shows an example of a first conventional high voltage diode structure. This diode includes an N-type central area 1 and includes on its upper surface side a P-type lightly-doped region 2 (P$^-$). PN junction 1–2 forms the junction of the considered diode. To ensure a sufficient breakdown voltage, the diode is of planar type, that is, the P$^-$ region is formed in a portion only of the upper surface of the central area and is completely surrounded at its periphery by an N region corresponding to the central area.

To establish a contact on the rear surface of the diode, the lower surface of the central area includes a heavily-doped N$^+$-type layer 3 coated with a cathode metallization 4. To take a contact on the upper surface of the diode, this upper surface is covered with a region 6 of an insulator, currently silicon oxide, which partially extends over region 2, a central region of layer 2 being cleared. In this central region, an overdoping is performed at the surface by forming a more heavily-doped P-type (P$^+$) region 7 covered with an anode metallization 8.

FIG. 2 shows another conventional example of a high voltage diode. The cathode side including central area 1, overdoped region 3 and cathode metallization 4, is unchanged with respect to FIG. 1. On the anode side, anode metallization 8 rests upon a heavily-doped P-type region 10 surrounded with a P$^+$-type ring 11. PN junction 1–10 this time forms the junction of the considered diode. As previously, an oxide layer 6 is present again at the surface, covering the periphery of region 10.

In the case of FIGS. 1 and 2, an ohmic contact has been made by forming a metallization directly on a heavily-doped P-type region. It is generally considered that the surface doping level of the P region must be higher than $5.10^{18}$ atoms/cm$^3$. Further, the periphery of the heavily-doped P-type region is surrounded with a lightly-doped P-type region to improve the reverse breakdown voltage of the diode.

Of course, various alternatives of the structures illustrated in FIGS. 1 and 2 are known in the art. To improve the breakdown voltage, to best spread the space charge displayed by the reverse-biased junction, additional lightly-doped P-type guard rings, and/or field plates at the periphery of the P$^-$-type region (2, 11) and separated from the semiconductor by an oxide layer are, for example, used. N$^+$-type regions, currently called stop layers, also block the potential lines likely to extend beyond the reverse-biased P$^+$-type region (2, 11), thus avoiding the occurrence of a channel leakage current.

Further, to make an ohmic contact, a heavily-doped P-type region is always present, but this region is not necessarily directly covered with a single metallization. Currently, anode and cathode metallizations 4 to 8 are formed of an aluminum layer but other materials are also conventionally used (TiNiAu, Molybdenum). Pilings of metallic layers and/or of alloys, possibly incorporating silicon, are also provided. A silicide interface (IrSi, PtSi, NiSi, . . . ) formed by solid-solid chemical reaction between the silicide and the metal which has previously been sputtered may be provided. These are widely preferred to metal-semiconductor conventional contacts due to their high thermal and chemical stabilities.

The fact that the anode layer is formed of a heavily-doped P-type region in direct contact with a lightly-doped N-type region (FIG. 2) or in contact with a lightly-doped P-type region itself in contact with a lightly-doped N-type region (FIG. 1) has various disadvantages.

The first disadvantage is the necessity of providing a heavily-doped P-type region and a lightly-doped P-type region at the periphery. This requires the provision of several masking steps and complicates the manufacturing process.

Another disadvantage is the mere fact of having to provide a heavily-doped P-type region, which implies the requirement of providing a relatively high temperature anneal step of relatively long duration, for example higher than 1150° C. for several hours, which takes up manufacturing time and is prejudicial to the crystalline quality of the silicon.

Eventually, and above all, in the case where it is desired to make a diode or another fast component, the P layer of which forms the anode, the presence of the heavily-doped P layer reduces the dynamic performance of the component including this P layer as an anode. Indeed, when the voltage applied to the diode is reversed, the diode must normally switch from the on state to the off state. But it is well known that a certain amount of time passes before the diode recovers its blocking ability. This time, currently called the recovery time, is that required for the evacuation of the carriers still stored in central area 1, which carriers have been previously injected by the anode region during the on-state operation. This carrier injection becomes higher as the doping of the P-type region increases. Thus, the rate of switching to the off state of the diode is limited by the presence of a heavily-doped P-type region. To overcome this disadvantage, the creation of defects in the central area and especially in the vicinity of the PN junction of the diode has been provided in prior art, for example by diff-using metals such as gold or platinum or by electron or proton bombarding or other. However, this solution causes other disadvantages and especially increases the forward voltage drop of the diode.

SUMMARY OF THE INVENTION

According to one aspect the present invention improves one-way components such as diodes or thyristors or even of components such as bipolar transistors meant to operate in a one-way mode, by reducing the recovery time, that is, the time of switching to the off state.

According to another aspect, the present invention provides a contacting structure that directly takes an ohmic contact on a lightly-doped P-type layer meant to be used as the anode of a one-way component.

More specifically, the present invention provides a contacting structure on a lightly-doped P-type region of a semiconductor component, this P-type region being meant to be positively biased during the on-state operation of said component, including on the P region a layer of platinum silicide, or of a metal silicide having with the P-type silicon a barrier height lower than or equal to that of the platinum silicide.

According to an embodiment of the present invention, the silicide is an iridium silicide.

According to an embodiment of the present invention, the P-type region has a surface doping level on the order of $10^{15}$ to $10^{16}$ atoms/cm$^3$.

According to an embodiment of the present invention, the periphery of the lightly-doped P-type region is covered with an oxide layer.

According to an embodiment of the present invention, the P-type region is formed in a portion of the upper surface of an N-type region.

According to an embodiment of the present invention, the P region forms the anode of a diode.

According to an embodiment of the present invention, the P region forms the anode of a thyristor.

According to an embodiment of the present invention, the P region forms the gate of a thyristor.

According to an embodiment of the present invention, the P region forms the collector of a PNP-type bipolar transistor.

According to an embodiment of the present invention, the component, the P-type region of which forms an anode, is a vertical component.

The foregoing characteristics and advantages of the present invention will be discussed in detail in the following non-limiting description of specific embodiments, in connection with the accompanying drawings.

DETAILED DESCRIPTION

As is conventional in the field of the representation of semiconductor components, the various cross-sectional views of components are very simplified and are not drawn to scale. Those skilled in the art will know how to choose the thickness of the central area, the junction depths and the lateral dimensions of the components according to the desired breakdown voltage and power performance.

Figure 1:
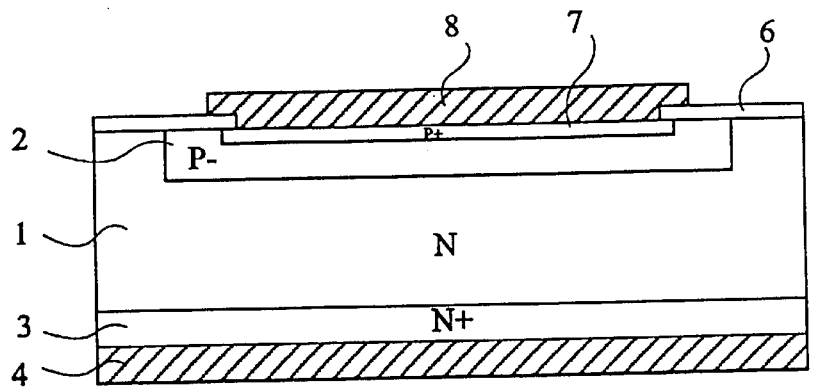
FIGS. 1 and 2 show prior art diode structures.
Figure 2:
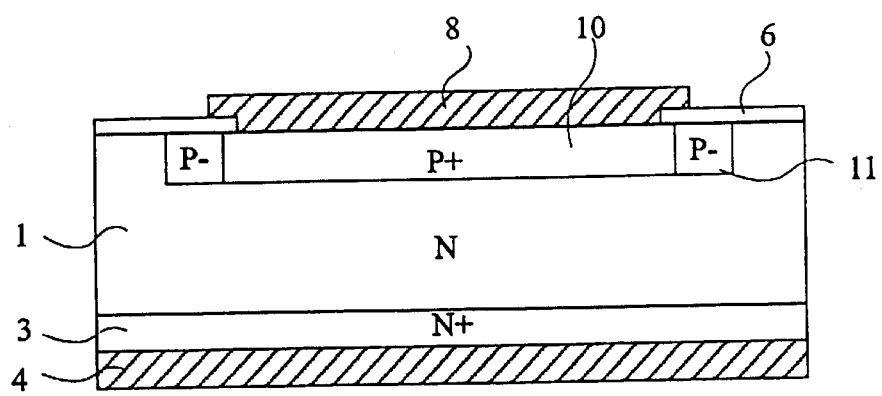
Figure 3A:
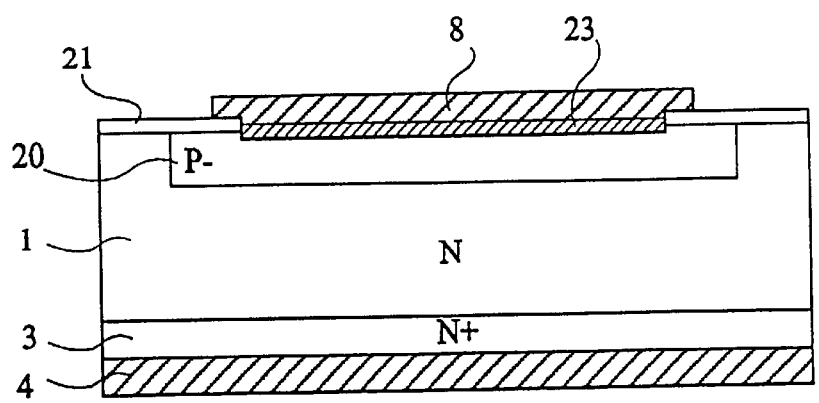
FIG. 3A shows an embodiment of the present invention applied to a fast high voltage diode.

FIG. 3A is a simplified cross-sectional view of a high voltage diode to which the present invention applies. The cathode region of the diode includes a lightly-doped N-type central area 1, a heavily-doped N-type region 3, and a cathode metallization 4, as in the examples of FIGS. 1 and 2. The anode region of the diode includes a lightly-doped P-type (P⁻) region 20, the periphery of which is covered with a layer of an insulator 21, for example, silicon oxide, to define a central contacting region on the P⁻ region. A platinum silicide layer 23, on which is formed anode metallization 8, with the possible intervention of layers used as a diffusion barrier, is formed in this central region.

The formation mode of a platinum silicide region such as layer 23 is well known in the art, and for example consists of performing a platinum deposition followed by an anneal at a temperature included between 500° C. and 600° C. followed by a selective etching of the excess platinum. Such silicide layers are known per se and are essentially used to make Schottky diodes and to obtain connections of low resistivity (essentially in the field of the manufacturing of integrated circuits). According to the present invention, the platinum silicide layer is used for none of these two conventional objects (Schottky diode or reduction of connection resistance) but for the implementation of an ohmic contact.

Figure 3B:
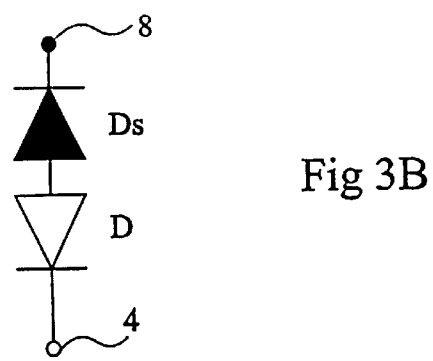
FIG. 3B shows an equivalent diagram of the structure of FIG. 3A.

FIG. 3B shows an equivalent diagram of the circuit of FIG. 3A. This equivalent diagram includes, between an anode terminal 8 and a cathode terminal 4, a bipolar diode D corresponding to the PN junction between region 20 and central area 1, and a Schottky diode Ds where the anode of diode D is connected to the anode of diode DS. Diode DS corresponds to the interface between platinum silicide region 23 and region 20. Such a structure obtains a contact having an ohmic-type behavior in the case where diode D is likely to conduct (application of a positive voltage on anode 8), that is, when it is forward biased and Schottky diode DS is reverse biased. This will be explained in relation with FIG. 4.

Figure 4:
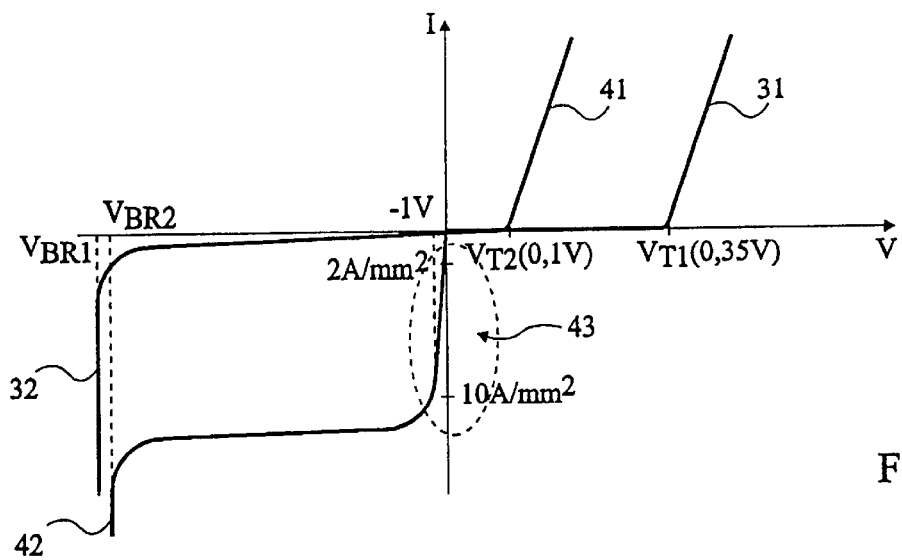
FIG. 4 schematically shows the characteristic of two types of forward and reverse Schottky diodes.

FIG. 4 shows the forward characteristic 31 and the reverse characteristic 32 of a conventional Schottky diode. Curves 41 and 42 show the forward and reverse characteristics, respectively, of a Schottky diode formed of the interface between a platinum silicide region and a lightly-doped P-type region. In FIG. 4, the voltage and current scale is not the same in the forward operation quadrant (curves 31 and 41) and in the reverse operation quadrant (curves 32 and 42) of the Schottky diodes.

Curves 31 and 32 illustrate the characteristic of a conventional Schottky diode, for example a Schottky diode formed of a titanium silicide (TiSi$_2$) formed on a lightly-doped P-type region.

The forward characteristic, 31, that is, the characteristic of a Schottky diode where the P⁻ layer is used as an anode and the silicide layer is used as a cathode is a conventional forward diode characteristic. The current remains substantially null until the voltage across the diode reaches the threshold turn-on voltage $V_{T1}$ of this diode, for example, a voltage on the order of 0.35 and then, when the voltage exceeds this 0.35 volt value, the voltage drop across the diode is essentially controlled by the ohmic voltage drop due to the series resistors of the structure.

In reverse biasing, the characteristic illustrated by curve 32 is obtained. The diode substantially blocks any reverse current flow until a breakdown voltage VBR1, for example, on the order of 50 V.

In the case of a Schottky diode made between lightly-doped P-type silicon and a platinum silicide, the forward characteristic, 41, is not very different in its shape from previously described forward characteristic 31. The essential difference is that turn-on threshold $V_{T2}$ is lower than $V_{T1}$, for example, on the order of 0.1 volt and not of 0.35 volt or more. But mostly, the shape of reverse characteristic 42 is strongly modified. In an initial area 43 of reverse voltage application, this characteristic is substantially that of a resistor of very low value. Indeed, when a current density of 2 A/mm$^2$ flows, which is the typical operating state of a high voltage diode, the voltage drop across the diode is lower than 100 mV. And as long as a current density tends to be circulated at a value lower than a value on the order of 10 A/mm$^2$, the voltage drop across the diode remains very low (on the order of 1 volt).

The present invention implements the use of this portion 43 of the reverse characteristic of a Schottky diode formed between a lightly-doped P-type region and a platinum silicide, to make an ohmic-type contact on a lightly-doped P-type region. Clearly, the present invention is limited to the case where the P-type region is used as the anode of a component, that is, in the case where the Schottky diode is reverse biased.

It should be noted that this is completely different from a conventional case in which the same Schottky diode is used, sometimes in reverse, sometimes forward, neglecting the low forward voltage drop on the order of 0.1 volt. Indeed, in the forward direction, there is no longer an ohmic behavior but only a non-ohmic behavior with a low voltage drop. This means that a power consumption which will for example be 1 W/mm$^2$ for a current of 10 A/mm$^2$ in the diode adds to the ohmic losses.

Figure 5:
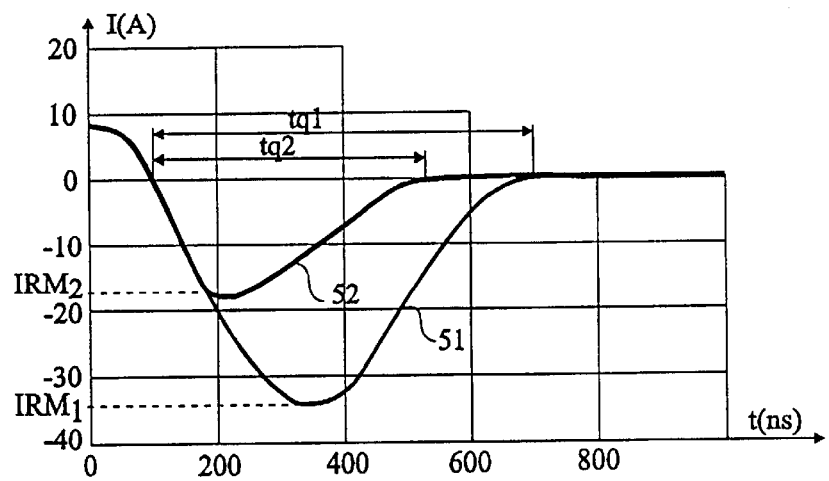
FIG. 5 shows a curve of current over time illustrating the dynamic features of a diode according to the present invention and of a prior art diode.

FIG. 5 illustrates the improvement brought to the dynamic features of the diode according to the present invention.

This drawing shows curves of the current in amperes as a function of time in nanoseconds. In these curves, time zero corresponds to the time when the voltage applied to the diode, initially, in the conductive state, is inverted. Thus, initially, a current slightly lower than 10 amperes flows through the diode. Then, this current decreases rapidly, then reverses, that is, the diode is temporarily conductive in reverse, before returning to the blocked state for which the current is equal to zero. Clearly, it is desired in practice to reduce this reverse conduction as much as possible. The reverse current peak is generally designated by reference $I_{RM}$ and the time interval between the two zero crossings of the curve is called the recovery time, and designated by reference $t_q$.

In FIG. 5, the curve designated by reference 51 corresponds to a conventional high voltage power diode such as that in FIG. 2 and curve 52 corresponds to a diode of same dimension according to the present invention, of the type illustrated in FIG. 3A. Reverse current peak $IRM_1$ of the conventional diode is on the order of 35 amperes while reverse current peak $IRM_2$ is lower than 20 A. Recovery time $t_{q1}$ of the conventional diode is on the order of 550 nanoseconds while recovery time $t_{q2}$ of the diode according to the present invention is only on the order of 390 nanoseconds. The diode according to the present invention thus clearly has a considerably improved dynamic operation with respect to a diode with a conventional anode contacting area on a P$^+$-type region.

Of course, the present invention is likely to have various alterations, modifications, and improvements which will readily occur to those skilled in the art.

On the one hand, improvements conventionally brought to the diodes described in relation with prior art can also apply to the present invention to improve the reverse breakdown voltage and leakage current characteristics.

On the other hand, although the present invention has only been described in the case where the contacting layer on a P$^-$-type region is in platinum silicide, it will be clear to those skilled in the art that any equivalent silicide can be adopted. The condition is that the Schottky barrier height on the P$^-$-type region is lower than or equal to a value on the order of 0.3 volt (the same type of behavior as occurs in reverse). This is for example the case for an iridium silicide, having a Schottky barrier height on the order of 0.19 volt. A reverse characteristic of the type of that illustrated by curve 42 including a region 43 where the reverse component is of ohmic type with a very low resistance value is then obtained.

Further, the present invention has been described in the context of its application to a high voltage power diode. It should be clear that it generally applies to any device in which it is desired to establish a contact on a lightly-doped P-type region, and meant to operate as an anode. The suppression of a P$^+$-type layer limits the carrier injection phenomenon and improves the recovery time at the switching to the off state. This is especially useful for the anode of a thyristor or an equivalent component or for the collector of a PNP-type transistor (this does not apply to the emitter, which is at the contrary meant to operate as a cathode).

Figure 6:
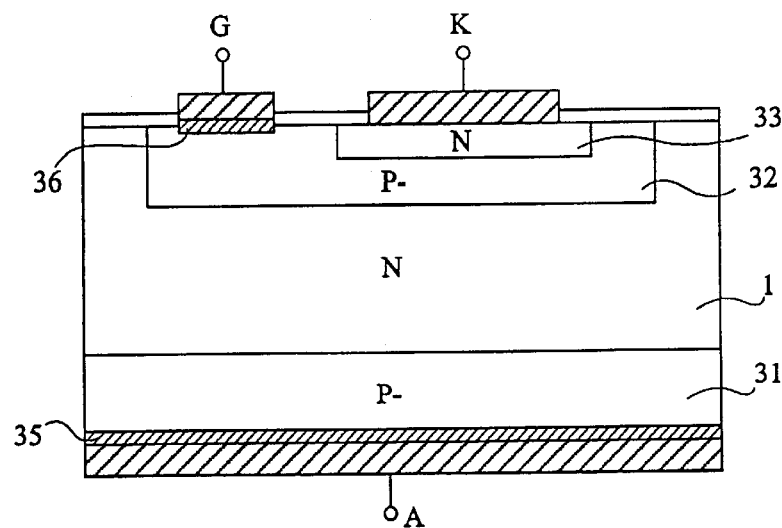
FIG. 6 shows a thyristor structure to which the present invention is applied.

As an example, FIG. 6 shows a thyristor for which the present invention has been implemented. This thyristor includes an N-type central area 1. On the rear surface side, a P-type anode 31 is formed, and on the front surface side, a P-type gate region 32 is formed. Preferably, layers 31 and 32 are formed simultaneously. A cathode region 33 of heavily-doped type is formed in region 32. A cathode metallization K is formed conventionally on cathode region K.

According to the present invention, P regions 31 and 32 are medium doped and anodec and gate contacts A and G are taken via platinum silicide layers 35 and 36. The main advantage of having a medium-doped anode region 31 is to improve the speed of switching to the off state. The main advantage of having a medium-doped gate layer 32 is to avoid having to use a P-type guard ring for high voltage thyristors. Of course, an additional advantage is the reduction of the number of implantation/diffusion steps.

Further, the present invention has been described here above in the context of its application to an insulated component (diode, thyristor, PNP transistor . . . ). It will also apply in the case where several components, that is, possibly several vertical components, are formed on the same chip. Several platinum silicide regions can also be formed simultaneously, one or several of these regions having the function used according to the present invention (ohmic contacting area on a lightly-doped P-type anode region), and one or several of these regions having a conventional function (formation of a Schottky diode, reduction of the connection resistivity).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A contacting structure directly in contact with a lightly-doped P-type silicon region of a semiconductor component, comprising:

a layer of platinum silicide, or of a metal silicide directly in contact with the lightly-doped P-type silicon region and having, with the P-type region, a Schottky barrier height lower than or equal to that of the platinum silicide or of the metal silicide, the lightly-doped P-type silicon region being positively biased during an on-state operation of the semiconductor component; and wherein the lightly-doped P-type silicon region has a surface doping level on the order of $10^{15}$ to $10^{16}$ atoms/cm$^3$.

2. The contacting structure of claim 1, wherein the metal silicide is an iridium silicide.

3. The contacting structure of claim 1, wherein the P-type region and the layer of platinum silicide, or of the metallic silicide form a Schottky barrier having a Schottky breakdown voltage at essentially 0.

4. The contacting structure of claim 1, wherein a periphery of the P-type region is covered with an oxide layer.

5. The contacting structure of claim 1, wherein the P-type region is formed in a portion of an upper surface of an N-type region.

6. The contacting structure of claim 1, wherein the semiconductor component comprises a diode, and wherein the P-type region forms an anode of the diode.

7. The structure of claim 6, wherein the component, the P-type region of which forms an anode, is a vertical component.

8. The contacting structure of claim 1, wherein the semiconductor component comprises a thyristor, and wherein the P-type region forms an anode of the thyristor.

9. The structure of claim 8, wherein the component, the P-type region of which forms an anode, is a vertical component.

10. The contacting structure of claim 1, wherein the semiconductor component comprises a thyristor, and wherein the P-type region forms a gate of the thyristor.

11. The contacting structure of claim 1, wherein the semiconductor component comprises a PNP-type bipolar transistor, and wherein the P-type region forms a collector of the PNP-type bipolar transistor.

12. An active semiconductor device, comprising:

a lightly-doped P-type region; and a metal silicide region disposed in direct contact with said lightly-doped P-type region and exhibiting with said P-type region a Schottky barrier height equal or lower than a Schottky barrier height of platinum silicide;

wherein during operation of said semiconductor device said lightly-doped P-type region is positively biased in an ON state of said semiconductor device;

and wherein the P-type region has a surface doping level on the order of $10^{15}$ to $10^{16}$ atoms/cm$^3$.

13. The semiconductor device of claim 12 wherein said Schottky barrier height is equal to or less than 0.3 volt.

14. The semiconductor device of claim 12 including a guard ring in the semiconductor device.

15. The semiconductor device of claim 12 including a stop layer in the semiconductor device.

16. A semiconductor device, comprising:

a lightly-doped P-type region being positively biased during an ON state of the semiconductor device;

a contacting structure including said lightly-doped P-type region being directly in contact with a metallic region and forming a Schottky barrier with said metallic region, wherein said metallic region includes a metallic silicide and said Schottky barrier has a Schottky breakdown voltage at essentially 0.

17. The semiconductor device of claim 16 wherein said metallic region includes platinum silicide.

18. The semiconductor device of claim 16 wherein said metallic region includes iridium silicide.

19. The semiconductor device of claim 16, wherein said Schottky barrier has a height equal to or less than 0.3 volts, and wherein said lightly-doped P-type region has a surface doping level less than $10^{18}$ atoms/cm$^3$.

20. The semiconductor device of claim 19 wherein said contacting structure exhibits initially an ohmic type resistance.

21. The semiconductor device of claim 19 wherein said metallic region includes platinum silicide.

22. The semiconductor device of claim 19 wherein said metallic region includes iridium silicide.

23. The semiconductor device of claim 19 wherein said lightly-doped P-type region has a surface doping level on the order of $10^{15}$ to $10^{16}$ atoms/cm$^3$.

24. A method of operating a semiconductor device having an anode and a cathode, comprising acts of:

conducting a first and negligible amount of current when the anode of the device is forward biased relative to the cathode of the device and a voltage across the device is less than a first positively valued voltage;

conducting a second amount of current that varies linearly according to the voltage across the device when the anode of the device is forward biased relative to the cathode of the device and the voltage across the device is greater than the first positively valued voltage;

conducting a third amount of current that varies linearly according to the voltage across the device when the anode of the device is reverse biased relative to the cathode of the device and the voltage across the device greater than a first negatively valued voltage and less than the first positively valued voltage;

conducting a fourth amount of current that is substantially the same as the third amount of current conducted by the device at the first negatively valued voltage when the anode of the device is reverse biased relative to the cathode of the device and the voltage across the device is less than the first negatively valued voltage and greater than a second negatively valued voltage; and conducting a fifth amount of current when the anode of the device is reverse biased relative to the cathode of the device and the voltage across the device is greater than the second negatively valued voltage, the fifth amount of current being substantially independent of the voltage across the device.

25. The method of operating the semiconductor device of claim 24, wherein the semiconductor device is a diode.

26. The method of operating the semiconductor device of claim 24, wherein the act of conducting the first and negligible amount of current includes an act of conducting the first and negligible amount of current when the anode of the device is forward biased relative to the cathode of the device and the voltage across the device is less than approximately 0.1 volt.

* * * * *

UNITED STATES PATENT AND TRADEMARK OFFICE
CERTIFICATE OF CORRECTION

PATENT NO. : 6,633,071 B1 Page 1 of 1
DATED : October 14, 2003
INVENTOR(S) : Cyril Furio It is certified that error appears in the above-identified patent and that said Letters Patent is hereby corrected as shown below:

Column 6,
Lines 35-43, should read:
-- According to the present invention, P regions 31 and 32 are medium doped and anode and gate contacts A and G are taken via platinum silicide layers 35 and 36. The main advantage of having a medium-doped anode region 31 is to improve the speed of switching to the off state. The main advantage of having a medium-doped gate layer 32 is to avoid having to use a P-type guard ring for high voltage thyristors. Of course, an additional advantage is the reduction of the number of implantation/diffusion steps. --

Signed and Sealed this

Thirteenth Day of January, 2004

JON W. DUDAS
*Acting Director of the United States Patent and Trademark Office*